United States Patent [19]

Griebel

[11] Patent Number: 5,434,389
[45] Date of Patent: Jul. 18, 1995

[54] DEVICE FOR MONITORING CURRENT IN AN INDUCTION HEATING COIL

[75] Inventor: Arthur H. Griebel, Troy, Mich.

[73] Assignee: Tocco, Inc., Boaz, Ala.

[21] Appl. No.: 162,997

[22] Filed: Dec. 8, 1993

[51] Int. Cl.⁶ .................. H05B 6/06; G01R 33/00
[52] U.S. Cl. ..................... 219/663; 219/664; 219/665; 324/126; 324/654
[58] Field of Search .......... 219/663, 664, 665; 324/654, 655, 126, 127

[56] References Cited

U.S. PATENT DOCUMENTS

| | | | |
|---|---|---|---|
| 3,579,280 | 5/1971 | Florance | 324/127 |
| 3,743,808 | 7/1973 | Kasper | 219/665 |
| 3,746,825 | 7/1973 | Pfaffmann | 219/665 |
| 3,882,370 | 5/1975 | McMurray | 219/663 |
| 4,021,729 | 5/1977 | Hudson, Jr. | 324/127 |
| 4,317,979 | 3/1982 | Frank et al. | 219/665 |
| 4,816,633 | 3/1989 | Mucha et al. | 219/665 |
| 5,015,944 | 5/1991 | Bubash | 324/127 |
| 5,223,789 | 6/1993 | Katsuyama et al. | 324/127 |

Primary Examiner—Philip H. Leung
Attorney, Agent, or Firm—Vickers, Daniels & Young

[57] ABSTRACT

A monitor device for creating a current signal having a voltage representative of the instantaneous alternating current in an induction heating coil connected to an alternating current supply by two closely spaced, parallel input conductors separated by a narrow gap or flux package through which flows the flux created by the alternating current in the parallel conductors. The monitor device comprising: a multiturn sensing winding, means for securing the winding between said parallel conductors and over the flux passage whereby the flux flowing through flux passage intersects the turns of the sensing winding, and means for creating the current signal by the induced voltage in the winding.

22 Claims, 13 Drawing Sheets

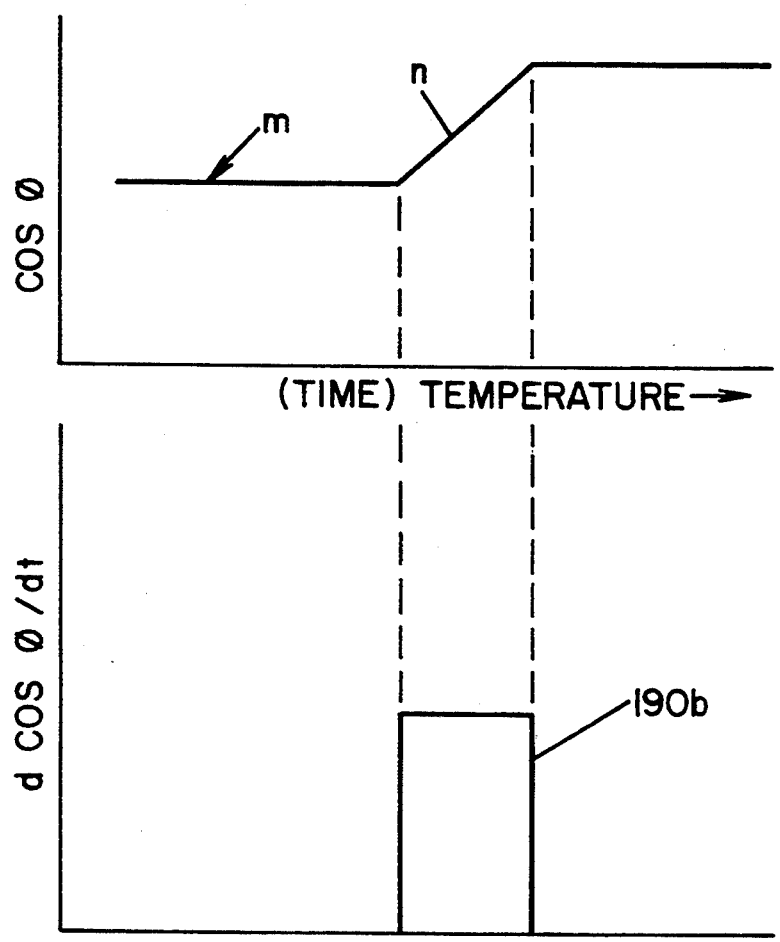

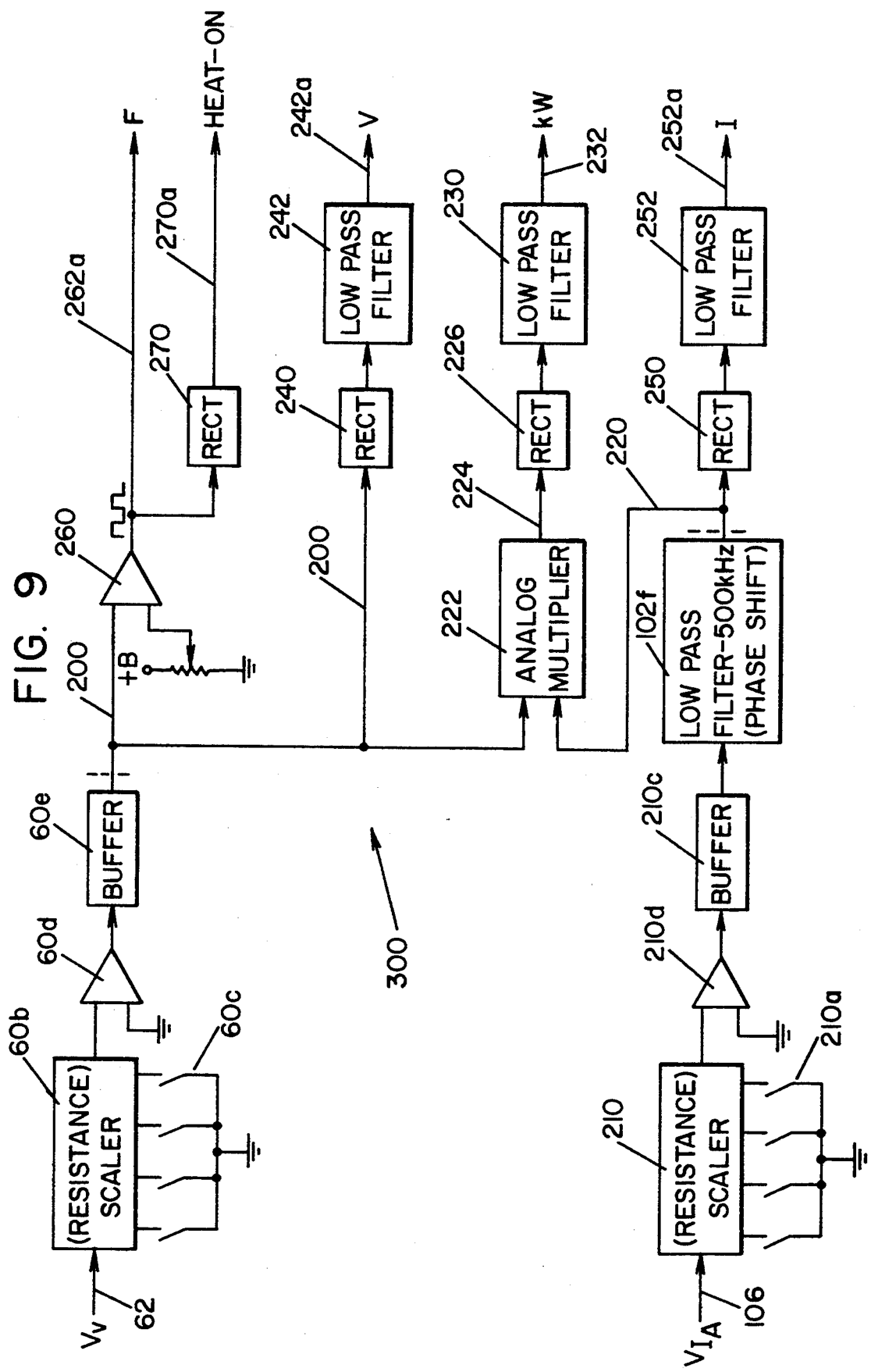

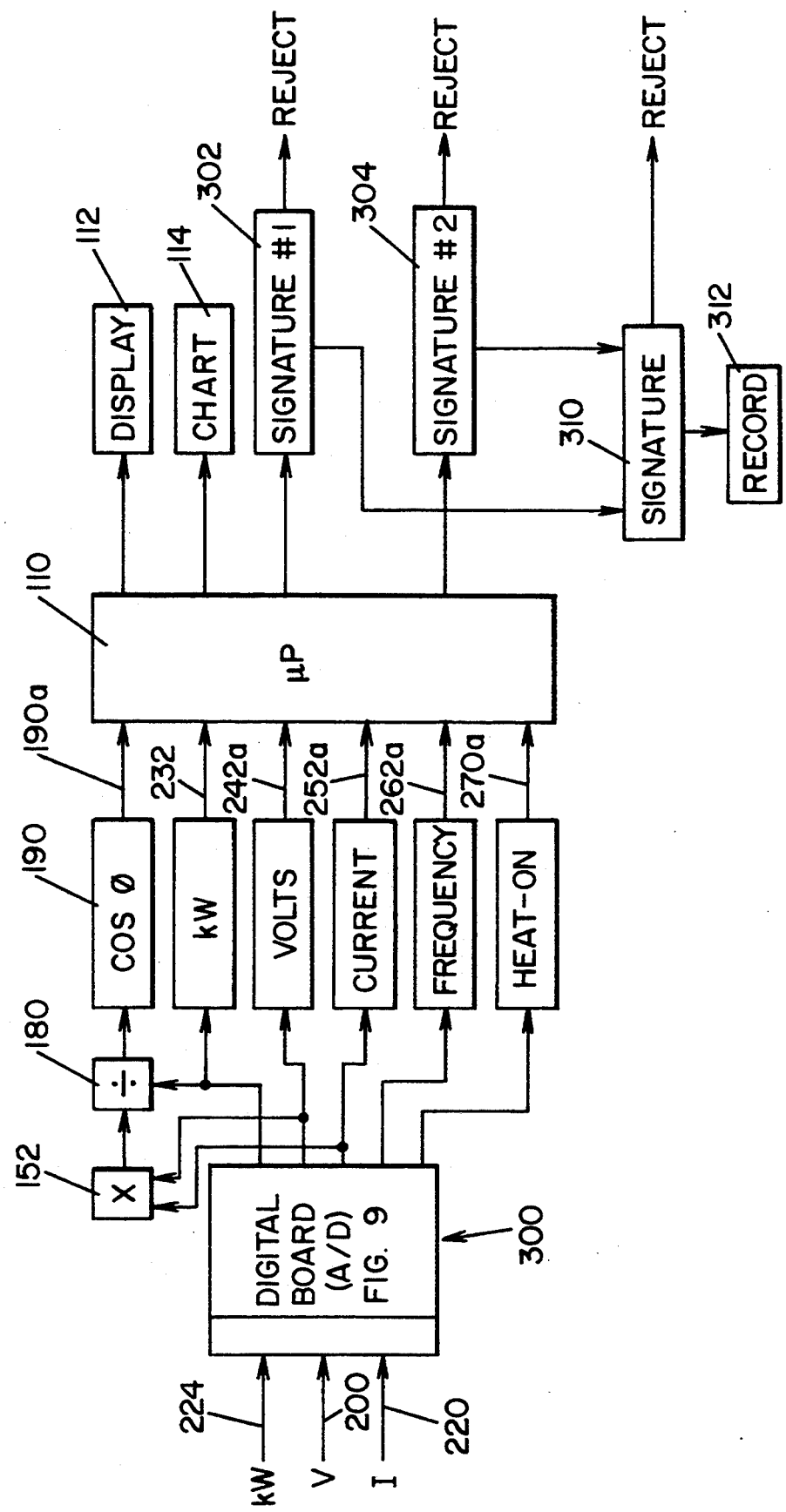

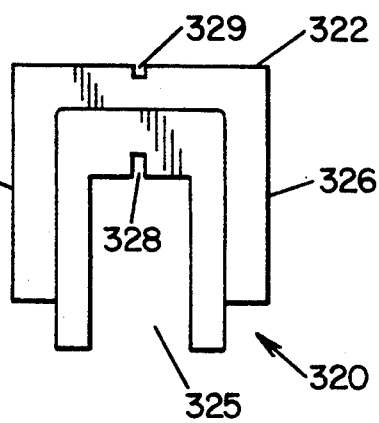
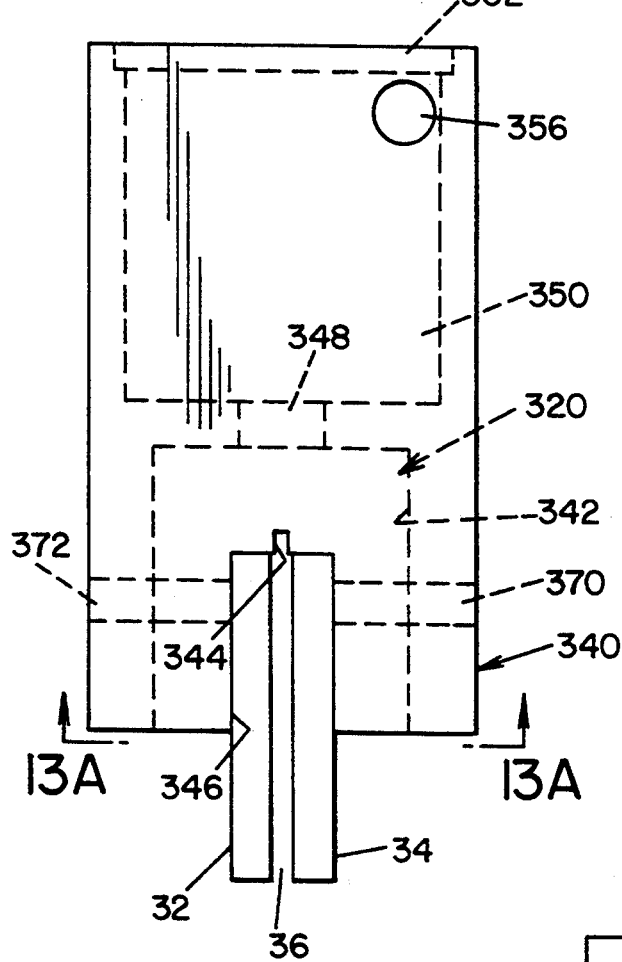
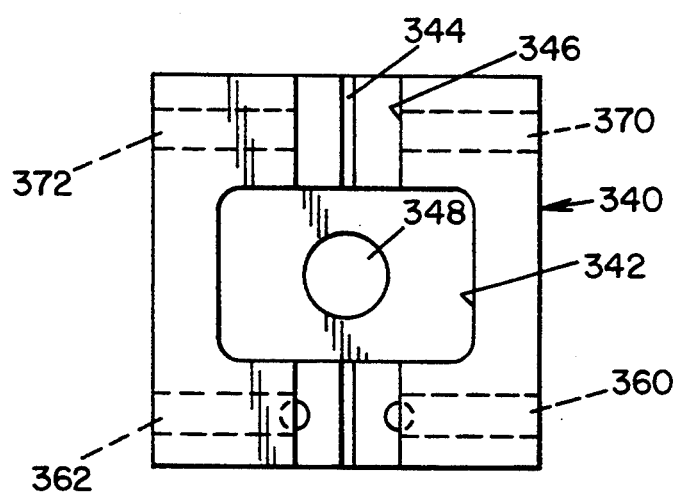

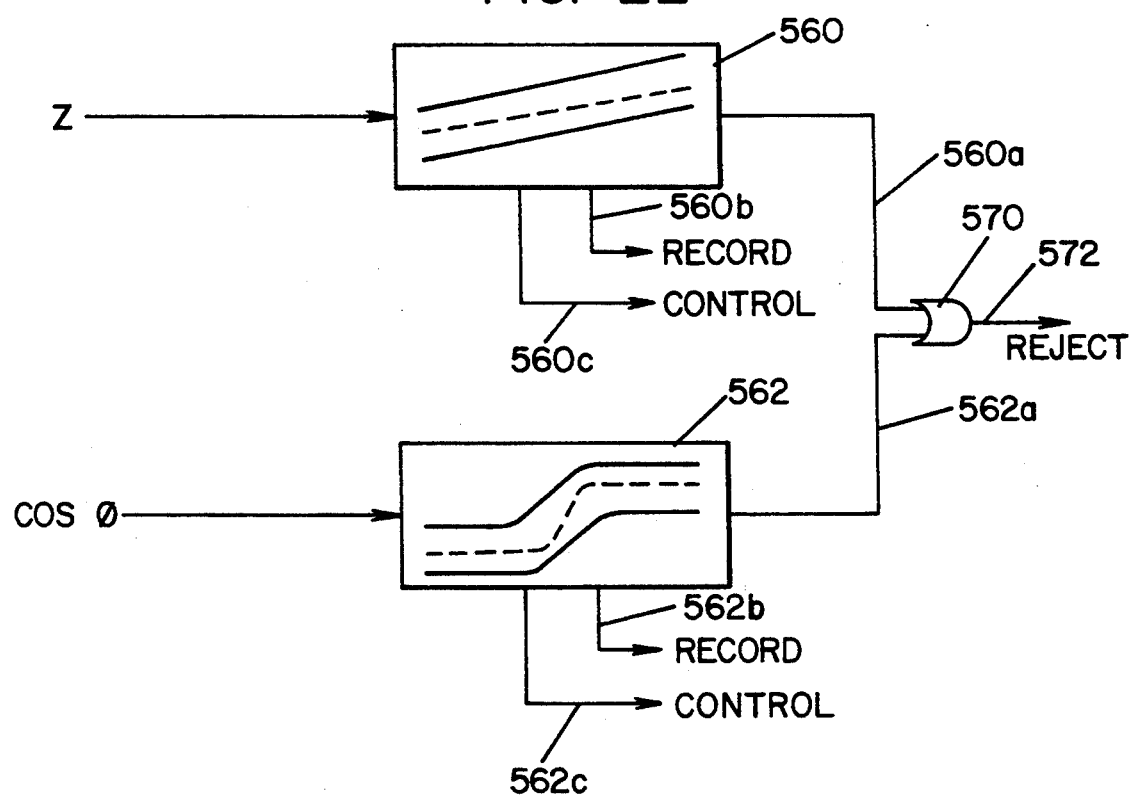

DEVICE FOR MONITORING CURRENT IN AN INDUCTION HEATING COIL

The present invention relates to the art of induction heating and more particularly to a coil monitoring device for monitoring the current of an induction heating coil during an operating cycle.

INCORPORATION BY REFERENCE

Pfaffmann 3,746,825 is incorporated by reference herein since it discloses a system and method for measuring input energy for an induction heating coil wherein the voltage and current of the coil are measured and combined to create an energy monitoring device useful for controlling the heating cycle of an induction heating installation. This system and method is the prior art to which the present invention is directed and includes an arrangement where the current in the induction heating coil is measured by a current transformer wrapped around one lead or bus extending from the work station or transformer to the inductor. The disclosure of this prior patent is the environment of the present invention and the technology described in this prior patent is incorporated herein as background information.

BACKGROUND OF INVENTION

In the induction heating art, it has long been known that control of the heating operation can be facilitated by measuring the coil voltage and coil current caused by the high frequency alternating current passing through the induction heating coil during a heating cycle. It has been a primary goal of such systems to measure the voltage and current immediately adjacent the induction heating coil; however, that has presented difficulty. When the current was measured by a shunt there had to be an interruption in the input conductor of the coil. A current transformer was used, as in the prior patent; however, the transformer was relatively large and had to encircle one of the input conductors or bus. For these reasons, monitoring the current at the coil itself has been attempted, but has not been extremely successful or practical. In addition, efforts to monitor the current and voltage of the heating coil have involved complex mechanical structures and retrofitting techniques which have not been conducive a majority of the induction heating installations.

THE INVENTION

The present invention relates to a coil monitor for creating a current signal having a voltage representative of the instantaneous alternating current in the induction heating coil. This novel coil monitor can also include a voltage pick up arrangement so that the monitor creates a voltage signal representative of the alternating current in the induction heating coil, as well as a voltage signal corresponding to the actual instantaneous voltage through the induction heating coil. By employing the present invention, the instantaneous current and voltage can be combined for the purposes of creating a wide variety of parameters including power, current, voltage, phase angles, impedance, frequency, heat time and other parameters.

In accordance with the present invention, the coil monitor device includes a multi-turn sensing winding, means for securing the winding between the parallel conductors leading into the induction heating coil and over the gap between the closely spaced conductors so that the flux flowing through this gap intersects the turns of the sensing winding to create a voltage which is a function of a current and frequency in the induction heating coil. The coil monitor also includes means for creating the current signal by using the induced voltage in the winding secured in a location between the input conductors or input buses of the coil and in the narrow gap leading into the induction heating coil.

In accordance with the present invention, the coil monitor includes means for sensing the rate of change of the flux flowing in the gap between the closely spaced, parallel input buses connected to the induction heating coil, which buses are normally referred to as the "fishtails." The monitor includes means responsive to the current sensing means for creating a voltage signal as a function of the magnitude and frequency of the alternating current passing through the induction heating coil and means for electrically removing the frequency function from the voltage signal to give a new voltage signal whereby the new voltage signal is a function of the magnitude of the current flowing through the induction heating coil. In accordance with an aspect of the invention, the induced voltage in the sensing means is a function of frequency and has a phase shift of 90°. A somewhat standard low pass filter operated in the higher frequency range, defined by the roll over characteristic of the filter, is employed for creating a voltage signal representative of the current through the induction heating coil. In accordance with this aspect of the invention, the voltage from the sensing winding is a straight line function of the frequency with a value increasing with the frequency. In a reciprocal manner the rolloff frequency of the low pass filter decreases as a straight line function which decreases as frequency increases. By passing the voltage from the sensing winding through the low pass filter, the actual voltage signal from the coil monitor is representative of the actual current flowing through the induction heating coil. The voltage can not be read as an absolute current value, but is a level indicative of a certain current flow. In this manner, the current signal from the coil monitor varies with the actual current flowing through the coil. In accordance with an aspect of the invention, the output voltage signal representing current in the coil monitor can be scaled down by resistance network or other arrangements to accomplish a desired current representation for a given process. In this manner, the voltage of the current signal will be a function of the actual current above and below the preselected scaled voltage indicative of a fixed, but unknown, current flow. Consequently, the present invention produces a voltage level or signal which is indicative of the actual current flowing through the induction heating coil. The absolute current magnitude is not necessary for process monitoring. Current levels can be used in creating a kW signal and signals representative of other current related parameters. Thus, the voltage signal indicative of the current flow through the induction heating coil can be employed in any graph, display, signature analysis or other use of the current and current related parameters, such as power and phase angle.

The primary object of the present invention is the provision of a device for monitoring the current in an induction heating coil during an induction heating cycle, or a testing cycle, which device creates a voltage signal indicative of the instantaneous current in the induction heating coil.

Another object of the present invention is the provision of a device, as defined above, which device can be easily assembled on and disassembled from existing induction heating installations.

Still a further object of the present invention is the provision of a monitoring device, as defined above, which monitoring device can be employed for verifying consistent power at the coil, consistent voltage at the coil, consistent current at the coil, consistent impedance at the coil, and consistent heat time, as well as condition of the part, part size and part location.

Another object of the present invention is the provision of a coil monitoring device, as defined above, which coil monitoring device can locate flanges by monitoring phase angles and other electrical parameters, locate diameter changes on a part being scanned, detect the end of a scanned part, and measure the tempering of the workpiece being monitored.

The present invention can monitor the radio frequency energy of an induction heating coil; however, it has broader applications and can be used in interactive and interproactive induction heating processes.

By creating a voltage signal indicative of the actual current in the induction heating coil, the in-phase voltage and current for induction heating coil can be measured. The voltage and current can be used for display, strip chart generation, computer activated system control and signature analysis. In accordance with the present invention, the monitor can adjust for variable frequencies, that is the result of an inductor/part match changes plus variations in the power supply frequencies prompted by the reactive control characteristics of the power supply. In accordance with the present invention, the system employs a frequency compensating measuring scheme whereby the frequency component or function of the current is removed by passing the instantaneous voltage signal including the frequency function, through a low pass filter in the roll-off area having an inverse frequency function.

The present invention is highly sensitive to dynamic changes within the part being heated. These changes relate to the surface temperature and/or temperature profile, depth of current flow and other current driven workpiece characteristics. The system of the present invention operates similar to an eddy current technology; however, it is much more sensitive to actual conditions in the workpiece, since the coil monitor of the present invention measures dynamic changes at a greater depth within the workpiece. Consequently, the invention has broader range of capability than prior eddy current technology. The monitor of the present invention can use the full power range of induction heating power supply and also the flexibility of the microprocessor logic to process the sensed information generated by the coil monitor constructed in accordance with the present invention.

The present invention produces an output signal which is sensitive to the circumferential temperature variations of the workpiece; consequently, a system employing the present invention can detect actual part rotation, eccentricity, geometric shapes and changes and other relative positions within an induction heating coil. In addition, a system employing the coil monitor of the present invention can detect differences in the part temperature.

In accordance with another aspect of the present invention, a system employing a coil monitor constructed in accordance with the invention can generate a range of different signatures for a signature analysis network, or system, wherein the signatures are dependent upon the particular parameter being monitored including current, voltage, frequency shift, phase change and any other characteristic which can be created by combination of end phase voltage and current actually flowing through the induction heating coil. In addition, in accordance with another aspect of the invention, more than one parameter is employed for a signature analysis system so that a combined signature analysis system is created.

In accordance with another aspect of the invention, a new coil monitor constructed in accordance with the present invention is employed in specific systems, which systems are used to detect the presence of a part, eccentricity of a part, alignment of a feature part of the part with the coil, verification of the heat treat condition of the part, verification of the part size, verification of part location and detection of part run-out. The present invention can be used as replacement for eddy current equipment for non-destructive testing of workpieces.

In accordance with the present invention, a system is created which can locate flanges by monitoring impedance, in a manner which will allow accommodation of part size variations while maintaining constant coupling distance from the flange to initiate the heating cycle. The invention can locate diameter changes by impedance changes. Impedance is a function of the sensed voltage and the sensed current. The invention can detect the end of a scanned part by monitoring impedance. By using the present invention, the end of an elongated part can be hardened without overheating the end of the part. This accommodates workpiece length variations which occur because of normal part expansion during an induction heating cycle.

A system in accordance with the present invention can be used to control scan speed by maintaining a constant coil impedance as the part is scanned. The heating time or cycle of a part or workpiece is controlled by maintaining a constant value of energy or impedance as monitored by the present invention. Coil shaft straightness is assured by modulating the power at areas of the workpieces opposite to areas of the part which run-out. This run-out is monitored by a system employing the present invention. The workpiece run-out is detected by the present invention through either recording or reading power variations and/or impedance variations.

In accordance with another aspect of the invention, the quenching liquid of quenching a workpiece is controlled by the present invention. The coil impedance, as detected by the coil monitor, is used to represent a specific workpiece temperature which temperature is then compared to a reference temperature for the purposes of determining the quenching cycle of the workpiece.

The present invention is particularly applicable for billet heating using power control to maintain a constant coil impedance, as detected by the coil monitor of the present invention.

In accordance with an aspect of the invention, the induction heating coil for hardening an axle shaft is positioned adjacent the flange fillet and the coil impedance, as detected by the coil monitor of the present invention, is detected to determine the proper initial position of the induction heating coil prior to the scan hardening process. The scanning process is continued to the end of the axle shaft being scan hardened. The instant of termination for the heated cycle is based upon impedance changes, as detected by the monitor constructed in accordance with the present invention.

In accordance with the present invention, the coil monitor actually monitors flux at the coil, corrects current for frequency changes in the flux and supplies a voltage output signal with a level representative of a current level. This voltage is an output signal employed for controlling the power supply and for indicating any of the parameters discussed above. Of course, the voltage signal representative of the induction heating coil current is combined with a signal indicative of the voltage read by the coil monitor to create any of several different and distinct electrical parameters which can be, selectively or jointly, employed for the purposes of determining certain processed characteristics which are recorded, monitored, used for signature analysis or otherwise employed in process control of the induction heating installation.

In accordance with the invention, the current in the induction heating coil is detected by placing a winding of wire in the proximity of the split or gap separating the two halves of the conductors or buses leading to the induction heating coil. The flux generated by the current flow in the buses exits the slit or gap and is intercepted by the winding or proximity coil. The voltage induced in the coil represents a scaled measurement of the current in the buses. The proximity pick-up coil, in accordance with the present invention, extends perpendicularly across the slit or gap and down the opposite sides of the buses in an effort to collect a maximum amount of magnetic flux exiting from the slit in a one centimeter length of the slit or gap. The pick-up or sensing wire or coil is wrapped on a G10 form and the G10 form fits snugly over the two conductors or buses. The voltage induced in the pick-up coil or sensing winding is a function of the geometry of the conductors, the current in the conductors, the number of turns in the sensing winding or pick-up coil and the frequency of the current. For a given pick-up or proximity coil and conductor geometry, the current measurement for the sensing winding will vary with the frequency of the current flowing through the induction heating coil. For instance, 100 amperes in the induction heating coil will induce three times as much voltage in the sensing winding when the coil operates at 3 kHz, as when the coil operates at 1 kHz. The coil monitor constructed in accordance with the present invention contains special circuitry in the form of a filter to correct for the frequency effect on the induced voltage signal from the sensing winding. The filter, as described above, corrects the voltage signal from the winding so that 100 amperes of current at 1 kHz will produce the same voltage level from the monitor as 100 amperes at 3 kHz. The use of the proximity coil and the removal of the frequency function or component of the voltage signal to produce a voltage level indicative of a current level in an induction heating coil is novel. This unique current sensing arrangement for an induction heating coil allows a large number of individual parameters to be created for providing the various system controls so far described. The coil monitor also measures the in-phase voltage by connecting the primary side of a small signal transformer to the two conductors at the induction heating coil. The secondary winding of the transformer is in the coil monitor and is wound on an insulating bobbin with a 1/32 inch of nylon separating the primary winding and the secondary winding for voltage isolation. The transformer in the housing for the monitor provides a 5:1 Voltage transformation. This ratio is found convenient for audio frequency induction heating installations below substantially 10 kHz.

In accordance with another aspect of the present invention the sensing winding and the voltage transformer are enclosed in a single G10 laminate housing. This housing provides a compact sealing unit which is potted with an electrical resin for complete insulation and water resistance. The housing itself contains a slot into which the two conductors or buses can be inserted and utilizes four set screws which hold the housing firmly onto the two conductors at the induction heating coil. Two of the set screws provide an electrical connection for the voltage transformer, as explained above. The other two set screws are isolated and provide mechanical attachment of the coil monitor over the "fishtail" or input leads of the induction heating coil. This housing provides a convenient arrangement for terminating the cable and for making attachments to the transformer and sensing winding. All electrical connections are completed prior to potting of the total assembly. The cable of the coil monitor is locked in place and all components are rigidly held so that there is no strain on the electrical connections due to normal installation of the assembly over the input leads of an induction heating coil. Both the voltage and the current signals are communicated with the system being controlled through a single four conductor cable. The cable has two shielded pairs, one for the voltage signal and one for the current signal and an overall current copper braid shielding. This harness is connected to the input of a microprocessor and analog to digital input stage for the purposes of creating the various signals to be employed in utilizing the coil monitor constructed in accordance with the present invention.

These constructions and the objects and advantages discussed above become more apparent when considering the following drawings:

BRIEF DESCRIPTION OF DRAWINGS

FIG. 8 illustrates two graphs showing an operating characteristic of one aspect of the present invention;

FIGS. 9 and 10 are block diagrams of the control circuitry for operating several electrical parameters employed for using the present invention in various systems employing induction heating principles;

FIG. 11 is an elevational view of the sensing winding employed in the coil monitor constructed in accordance with the preferred embodiment of the present invention;

FIG. 13 is a side elevational view of the support housing;

FIG. 13A is a cross-sectional view taken along line 13A—13A of FIG. 13;

PREFERRED EMBODIMENT

Figure 1:
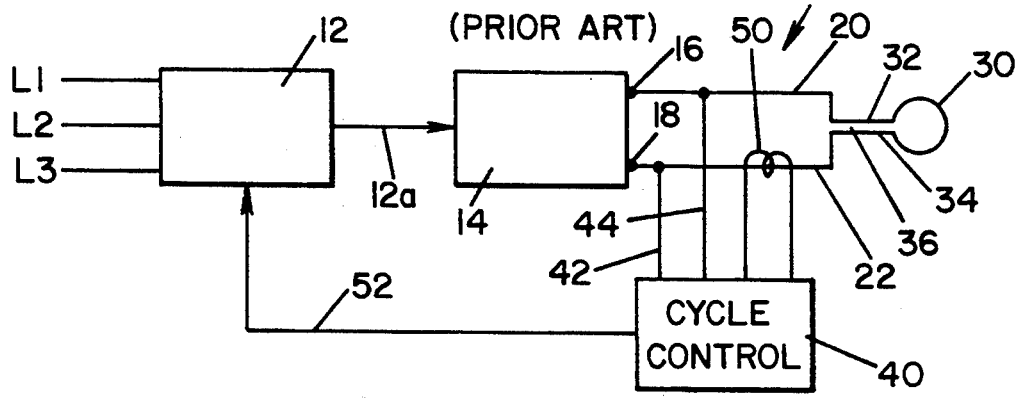
FIG. 1 is a schematic diagram of the prior art to which the present invention is directed.

Referring now to the drawings wherein the showings are for the purpose of illustrating the preferred embodiment of the invention only and not for the purpose of limiting same, FIG. 1 shows the prior art energy monitor system 10 for an induction heating installation of the type including an input three phase power supply 12 having output adjusted by a phase controlled SCR network, not shown, for directing a high frequency alternating current through line 12a to a work station 14 including the normal transformer and capacitor and having output terminals 16, 18 connected to output leads 20, 22. Induction heating coil 30 has two closely spaced, parallel conductors or buses 32, 34 separated by a slit, or gap, 36 which is normally 0.020–0.040 inches in width. Conductors or buses 32, 34 are large, generally flat parallel copper elements rigidly connected to coil 30 and form an electrical input structure, referred to as the "fishtail." The energy monitor system includes a control device 40, which is often referred to as the energy monitor. The total system 10 monitors energy directed to the workpiece by coil 30. To accomplish this objective, device 40 controls the amount of power applied to the workpiece by the coil and/or the length of the heating cycle. Voltage is sensed by contact with leads 20, 22 through sensing leads 42, 44. In accordance with the prior art system, a current transformer 50 is wrapped around one lead 20, 22 for creating a voltage which is communicated with control device 40. By combining the instantaneous current and voltage, the instantaneous power is determined. This power is integrated over time to provide the energy used by the induction heating coil 30 during a heating cycle. The voltage signal on line 52 controls the phase angle of the SCR network in power supply 12 to control the power being applied to the coil 30. Logic on line 52 can also be employed for initiating and terminating the heating cycle in accordance with standard induction heating technology.

Figure 2:
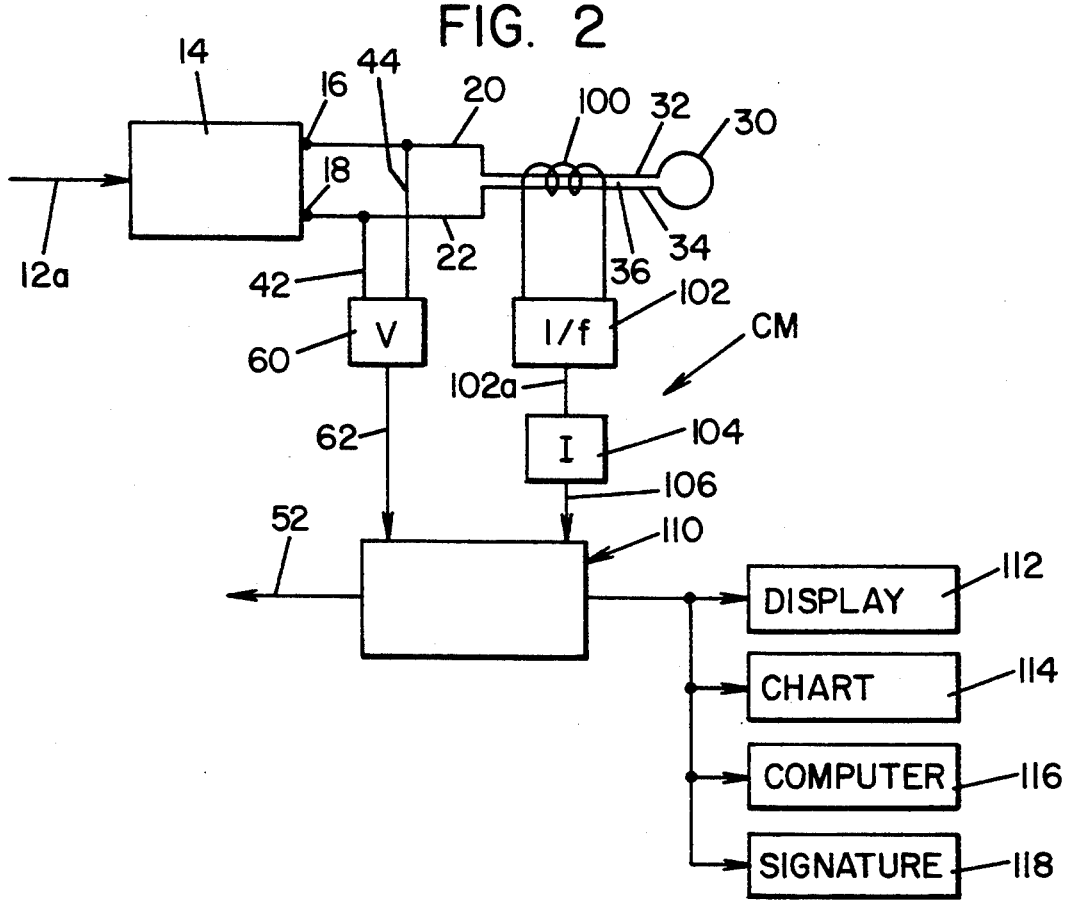
FIG. 2 is a schematic diagram of the preferred embodiment of the present invention.
Figure 20:
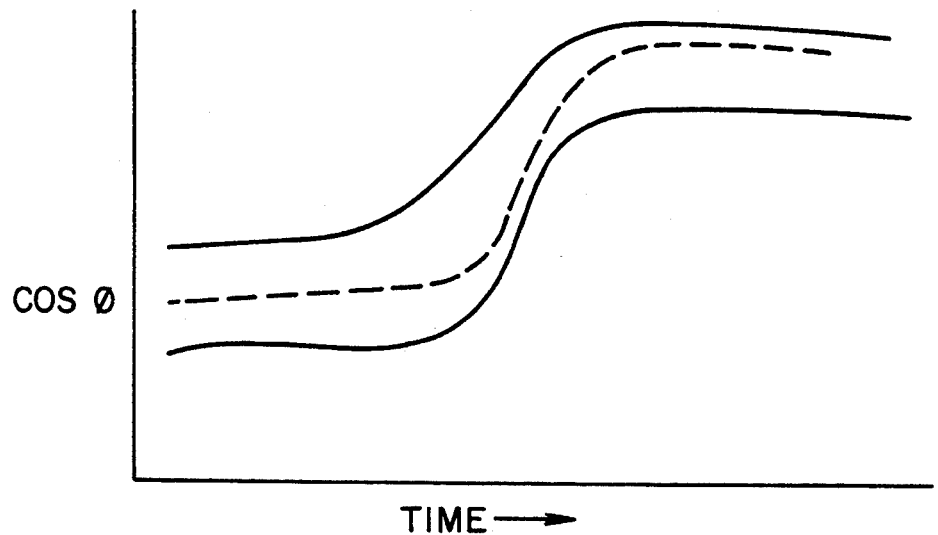
FIG. 20 is a graph illustrating a signature analysis readout of a system employing the preferred embodiment of the present invention; and, FIGS. 21 and 22 are schematic diagrams showing further applications of the preferred embodiment of the present invention in signature analysis systems.
Figure 21:
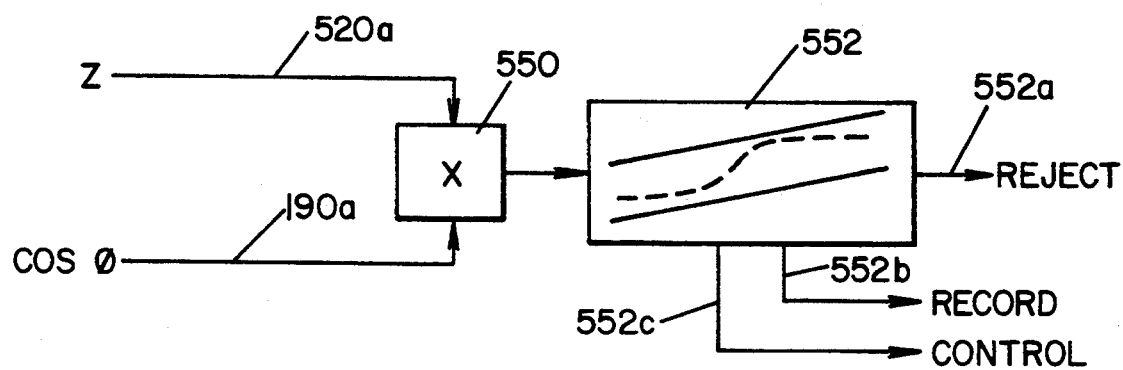

The present invention is employed for measuring the power directly at the load or coil 30 by using a concept where the current is measured directly at the fishtail formed by conductors 32, 34. In this manner, there is elimination of variations in the transmission lines, work stations 14 and transformers in both power supply 12 and work station 14. By using the present invention, the coil monitor system of the present invention can measure or create values indicative of coil energy, coil power, voltage, current, impedance, heat time and frequency. In addition, the present invention can be employed for detecting eccentricity of rotation, Curie point temperature, metallurgical condition of the workpiece, and the difference between a tempered and a non-tempered workpiece. Essentially, the current is measured at the coil itself by an easily applied structure, which structure or support housing can be retrofitted to most induction heating installations. The preferred embodiment of the invention involves a coil monitor CM as illustrated in FIG. 2 containing numbers identical to those used in FIG. 1 as they relate to substantially identical components. Coil monitor CM includes a support housing shown in FIGS. 11–13A and the electrical system for using data from the housing mounted components for performing the end result of the monitor. In the housing there are voltage pick up lines 42, 44 for measuring the A.C. voltage across leads 20, 22. A sensed voltage is directed to a voltage transformer 60, as previously discussed, to create a voltage signal in line 62 which has a level representative of the A.C. voltage across coil 30 as measured at leads 20, 22. A unique, novel sensing winding 100 is wrapped in several turns and placed over slit or gap 36 between parallel conductors or buses 32, 34. Sensing winding 100 is carried by the supporting housing and measures the flux passing through slit 36. This measurement is a voltage level shifted 90° and a function of coil current and frequency. A filter 102 which creates a 90° shift and is a low pass filter (about 500 Hz), operated in the roll-off ranger. The output in line 102a is an inverse straight line function of the frequency of the current in coil 30. Since the flux pick up winding 100 creates a voltage which is a direct straight line function of frequency and is shifted by 90°, filter 102 creates a voltage level in line 102a which level is representative of the current of coil 30. The level in line 102a does not have an absolute value directly readable as amperes. However, the voltage level in line 102a is a voltage signal representative of the actual current in coil 30. If the coil current doubles, the voltage in line 102a also doubles. Since an absolute value of current is not necessary for controlling the operation of coil 30 in an induction heating insulation, or in measuring the characteristics of workpiece scanned by coil 30, the provision of voltage level indicative of the actual current is sufficient for monitoring coil 30 and providing output signals indicative of coil energy, coil power, voltage, amphears, impedance, heat time and/or frequency. Filter 102 can be in the support housing or external of the housing portion of the coil monitor. In practice the filter is an external component. A scaler network 104 is located in the electrical circuitry remote to the support housing. The scaler adjusts the voltage level on line 102a to the desired level on line 106 for use by the microprocessor 110 with an input network, as best shown in FIG. 9. Microprocessor 110 receives the voltage signal representative of instaneous AC voltage upon line 62 and a voltage representative of instananeces AC current on line 106. These voltage signals are processed on accordance with the showing of FIG. 9 and used in accordance with the architecture of FIG. 10 to produce any of several selected, usable output techniques. As shown in FIG. 2, the parameters determined by coil monitor CM (a) can be displayed as direct read-out information indicated by block 112, (b) can be in the form of a sheet chart represented in FIGURE 14 as block 114, (c) can be in the form of information inputted to a computer for various types of process control as disclosed in this application and represented by block 116 or (d) can be used in signature analysis systems, as shown in FIGS. 20–22 and as represented by block 118.

Figure 2A:
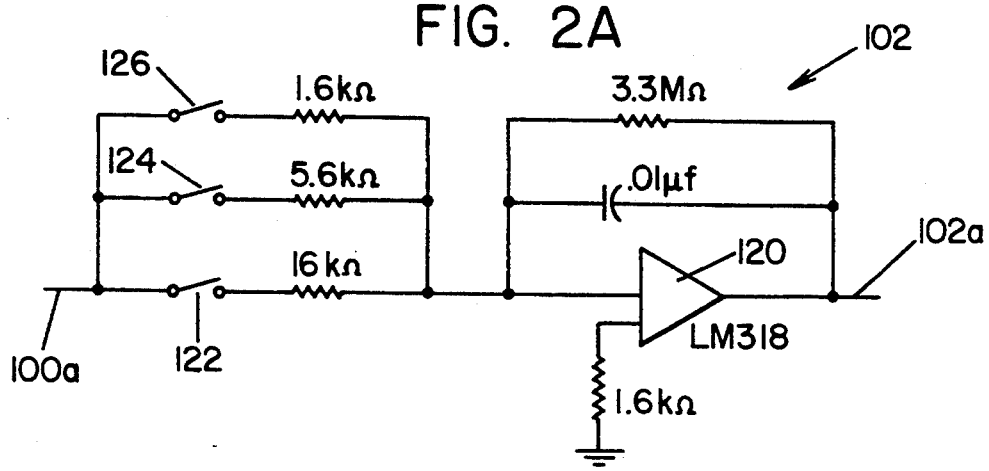
FIG. 2A is a wiring diagram of the low pass filter employed in accordance with the present invention.

The low pass filter 102 is shown in FIG. 2A where operation amplifier 120 passes low frequency and has a roll-off frequency level controlled by switches 122, 124 and 126. When coil monitor CM is employed for the purpose of monitoring a 1.0 kHz induction heating process, switch 122 is closed. Monitoring of a 3.0 kHz operation is done by closing switch 124. Switch 126 is closed when a 10 kHz induction heating process is employed. This low pass filter shifts the phase angle of the AC voltage on line 100a from winding 100 by 90° at output 102a. In addition, as the frequency on line 100a increases, the level of voltage in output line 102a decreases in a straight line function. The reverse frequency response function occurs on line 100a from sensing winding 100. The output voltage of winding 100 is a straight line function increasing with frequency. The operation of filter 102 is an inverse function of the frequency in the range of the frequency used in coil 30. Consequently, the output on line 102a is a voltage level that varies according to the actual current of induction heating coil 30.

Figure 3:
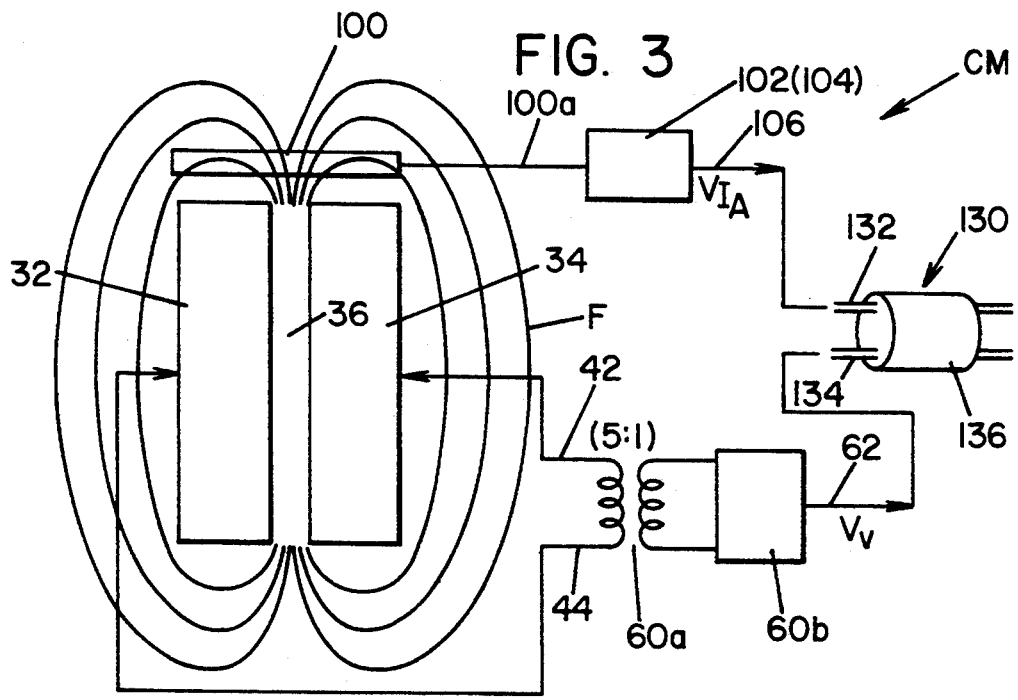
FIG. 3 is a schematic diagram of a coil monitor constructed in accordance with the present invention and illustrating the leads for voltage levels outputted from the monitor.
Figure 4A:
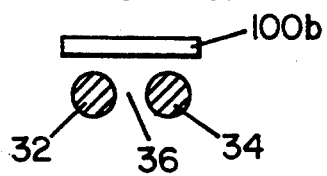
FIGS. 4A and 4B are diagrams illustrating modifications of the sensing winding employed in the preferred embodiment of the present invention.
Figure 4B:
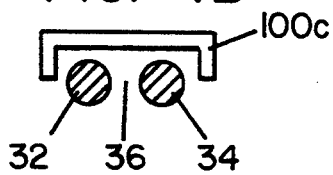
Figure 4:
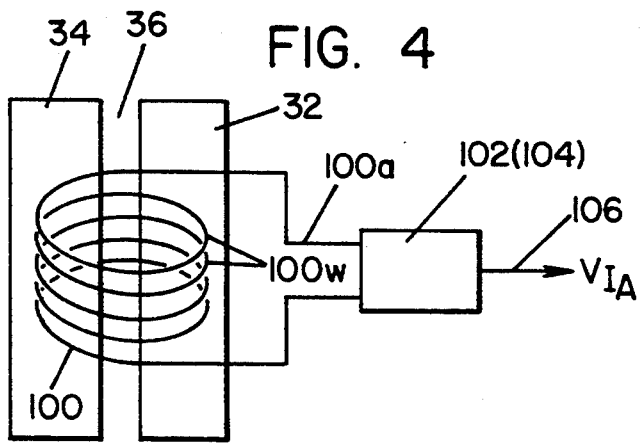
FIG. 4 is a further schematic diagram of the current sensing winding employed in the present invention.

In FIG. 3, the total coil monitor CM as applied to the fishtail portion of buses 32, 34 is illustrated. The voltage in lines 42, 44 is transformed by transformer 60a, having a ratio of 5:1, and is directed to a scaler 60b, best shown in FIG. 9. This action produces a voltage signal on line 62. A like matter, a current representative voltage signal appears on line 106. These signals are carried from the support housing or structure for the portion of coil monitor CM mounted on conductors 32, 34 through a flexible harness 130 having individual shielded leads 132, 134 for lines 106, 62 respectively. An overall copper shielding 136 is applied around leads 132, 134 to prevent any electromagnetic interference with the signals being directed from the local housing portion of coil monitor CM to the remotely located analog to digital board, shown in FIGS. 9 and 10. A schematic representation of the actual shape of winding 100 is illustrated in FIG. 4 wherein convolutions 100w are wrapped along the top of slit 36 between conductors 32, 34. In this matter, the flux passing upwardly, or downwardly, through slit 36 intersect the convolutions of sensing winding 100 to create a signal in line 100a. The number of convolutions 100w can be adjusted to cover a larger area of slit 36 and is not a feature of the present invention. In FIG. 4A the winding 100b is applied merely over the top of slit 36. In FIG. 4B the winding 100c is draped over the sides of conductors 32, 34 in a saddle-like configuration. The windings 100b, 100c are intended to intercept all flux F passing through slot 36 in the area monitored by winding 100, as shown in FIGS. 3 and 4. As so far explained, the present invention relates to a winding over slit 36 which will create a voltage signal having a level representative of current flow through coil 30. This is a unique, novel and a highly advantageous concept for determining the actual current flow in coil 30, which coil flow measurement is not affected by electrical variations from the power supply to coil 30. This concept is a primary aspect of the present invention and allows the advantages so far described in this application.

Figure 5:
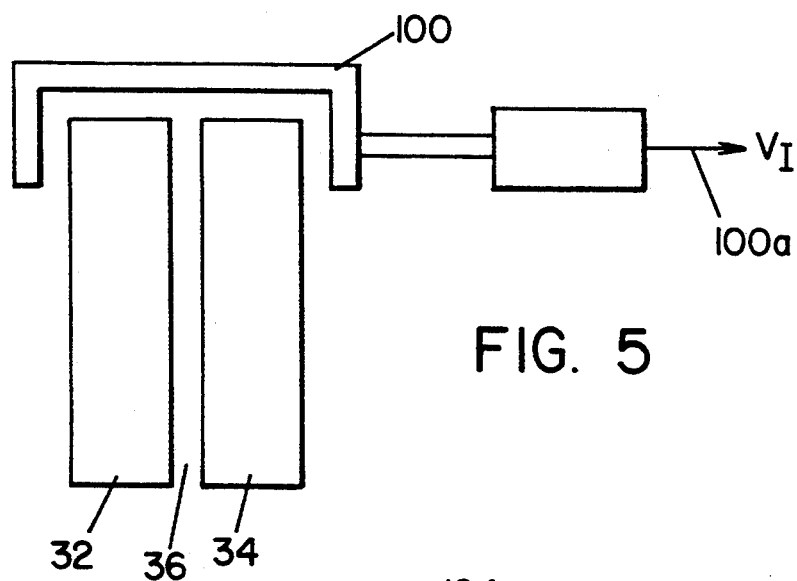
FIG. 5 is a schematic diagram illustrating still a further modification of the sensing winding used in the preferred embodiment of the present invention.
Figure 6:
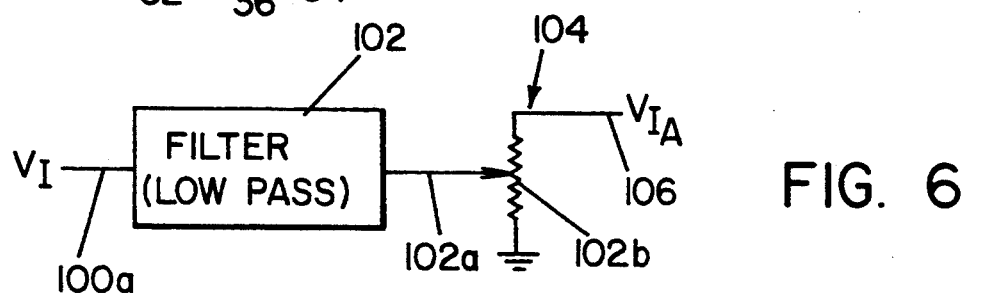
FIGS. 6 and 7 are partial block diagrams showing operating characteristics of certain aspects of the present invention.
Figure 7:
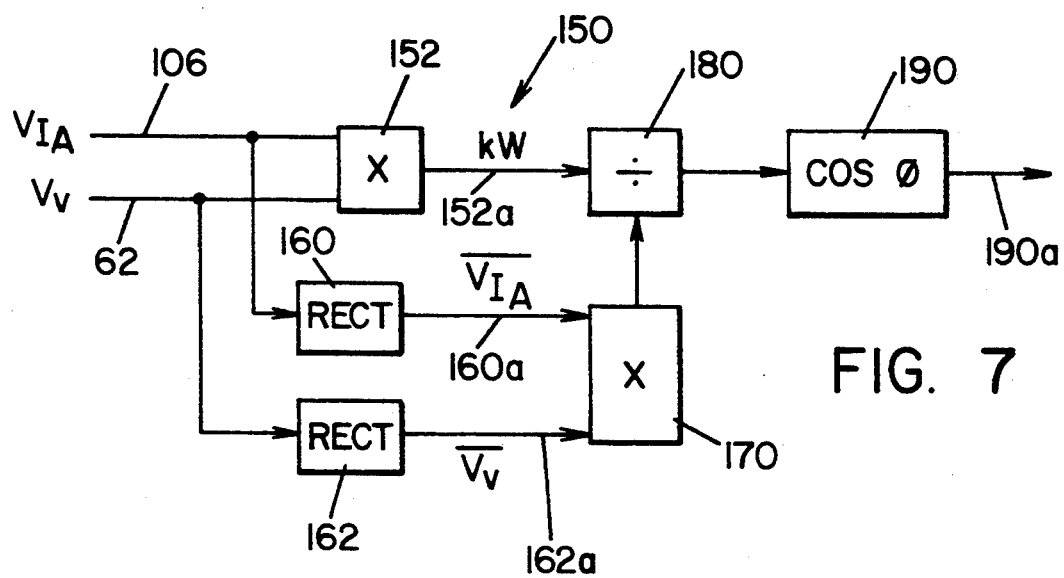

FIGS. 5 and 6 are combined to show the basic features of the preferred embodiment of the present invention. Coil 10 extends lengthwise along the top of gap 36 in a plurality of convolutions. In the preferred embodiment, the winding 100 is saddle-shape as shown in FIG. 5. The output voltage signal in line 100a is directed to filter 102 having an output 102a as illustrated in FIG. 2A. A voltage divider 102b is the first scaler 104 for adjusting the current signal to create a given voltage in line 106. The elements of FIGS. 5 and 6 are remote the support structure portion of coil monitor CM. Voltage on line 106 is outputted to an analog to digital converter and to a microprocessor as previously described. These two signals, 62, 106 are combined to produce a cosine of the phase angle between the current and voltage of coil 30. A schematic represented cosine sub-routine, in block diagram form, is illustrated in FIG. 7. The cosine function of the phase angle is a unique and distinct characteristic which changes drastically with certain metallurgical, temperature and structural changes of the workpiece in coil 30. The sub-routine is shown as a network 150 where current and voltage are multiplied, as indicated by block 152. This produces an instaneous reading of the actual power of coil C and appears at line 152a. The voltage signal 106 is rectified by rectifier 160 to produce a DC value representative of the coil current in line 160a. In like manner, rectifier 162 produces a DC value indicative of the voltage coil 30 in line 162a. The DC levels are multiplied by block 170 and form the divider of block 180. This block produces the quotient of the instaneous power divided by the product of DC current and DC voltage. This produces the cosine of the phase angle, as represented by block 190 having an output 190a. These same components are illustrated in the output network shown in FIG. 10. FIG. 8 illustrates a graph wherein the cosine of phase angle is plotted against time. This is a graph m which shifts from a lower level to a higher level in area n. In this illustration, the phase angle changes when the workpiece passes through the Curie point temperature. By taking the differential of the curve m, shown in the upper graph of FIG. 8, a pulse 190b is created. The leading edge of this pulse indicates when the workpiece is passing through a Curie point temperature. The phase angle cosine changes drastically in accordance with other parameters and is used as an easily detectable parameter for detecting various characteristics and changes experienced by coil 30 as it moves along workpiece being heated or moves along workpiece being measured in accordance with somewhat standard eddy current techniques.

The present invention has been explained with respect to the creation of both the voltage signal in line 62 and the current signal in line 106. These two values can be used in a variety of analog and digital systems for creating several parameters readable indicative of the function of coil 30. By the invention the current is sensed and measured as a voltage level from a structure located directly adjacent coil 30. This feature has not been used in the induction heating field. The particular circuitry, microprocessors, computers and hardware for using the several parameters can take a variety of well known, standard forms. In the preferred embodiment, the coil monitor is used to create a variety of parameters and to accomplish a variety of objectives, as schematically illustrated in FIGS. 9 and 10. Referring now to FIG. 9, scaler 60b has a switch network 60c for scaling the magnitude of the voltage signal on line 62. This signal is then amplified by amplifier 60d and passed through a buffer 60e. This circuit creates a voltage signal on line 200 which is an AC signal representing the voltage at coil 30. In like manner, scaler 210 has a switch network 210a that creates a signal at the input of amplifier 210d. This amplified signal is then passed through buffer 210c. In the preferred embodiment of the present invention, filter 102 is actually remote from the support structure although it can be potted in the support structure in some embodiments. A remote filter is schematically illustrated as the low pass filter 102f in FIG. 9. This low pass filter has a roll-off of 500 hKz and shifts the signal from buffer 210c by 90°. The remotely located filter 102f is the same as the filter 102, described in conjunction with FIG. 2. This disclosure illustrates an alternative location for the filter itself which, in the preferred embodiment of the present invention, is external of the actual coil monitor support structure which is placed over conductors 32, 34. Consequently, the coil monitor CM is the support structure mounted on the conductors 32, 34 and also the remote circuitry for creating parameter values based upon the output from the support housing or structure mounted directly at coil 30. The incoming signals are scaled to appropriate circuit levels by scalers 60d and 210. Lines 62, 106 are terminated in differential mold at the circuits shown in FIG. 9. The input to operation amplifier 60d is maintained in a differential mode in order to reject common mode voltages. The output of amplifier 60d is buffered by buffer 60e for use in the analog circuitry shown in FIG. 9. After the current signal is passed through filter 210c, the level of voltage on line 220 is representative of the AC current at coil 30. The output on line 220 is applied to an analog multiplier 222 together with the buffer voltage signal on line 200. The output 224 of multiplier 222 is rectified by rectifier 226 to pass through a low pass filter 230 to produce a voltage in line 232 representing the kilowatt level kw coil 30. In addition, the signal on line 200 is rectified by rectifier 240 and passed through low pass filter 242 to produce the DC voltage signal at line 242(a). The current signal on line 220 is rectified by rectifier 250 and passed through low pass filter 252 to produce a DC current value on line 252(a). In the upper portion of FIG. 9 comparator 260 is driven by the AC voltage on line 200. This produces a square wave output in line 262a which represents the frequency at coil 30. Microprocessor 110 counts the pulses on line 262a over a known time to read frequency. Rectifier 270 produces a Heat-On signal in line 270a. This signal is a logic 1 when a heating cycle is being performed by coil 30. All of these outputs, i.e. 232, 242a, 252a, 262a and 272a are DC parameters controlled by the AC voltage on lines 62, 106 from the support housing of coil monitor CM which is positioned adjacent coil 30. Digital board 300 is shown in the right hand portion of FIG. 9 and is schematically illustrated as the input portion of FIG. 10. The outputs of FIG. 10 include the display device 112 and chart creating hardware 114. The various parameters from the microprocessor can be used for signature analysis as indicated by blocks 302, 304. If the parameters do not match a given signature during the heating process, the workpieces are rejected, as indicated at the outputs of blocks 302, 304. Signature analysis block 310 is a combination of signature analysis systems using two separate signatures, either one of which will reject a workpiece when a parameter exceeds a profile. In accordance with this illustrated embodiment, the signatures, as created by microprocessor 110 or a computer, are recorded by appropriate hardware 312. Signature analysis using the present invention is explained in more detail in FIGS. 20–22.

Figure 12:
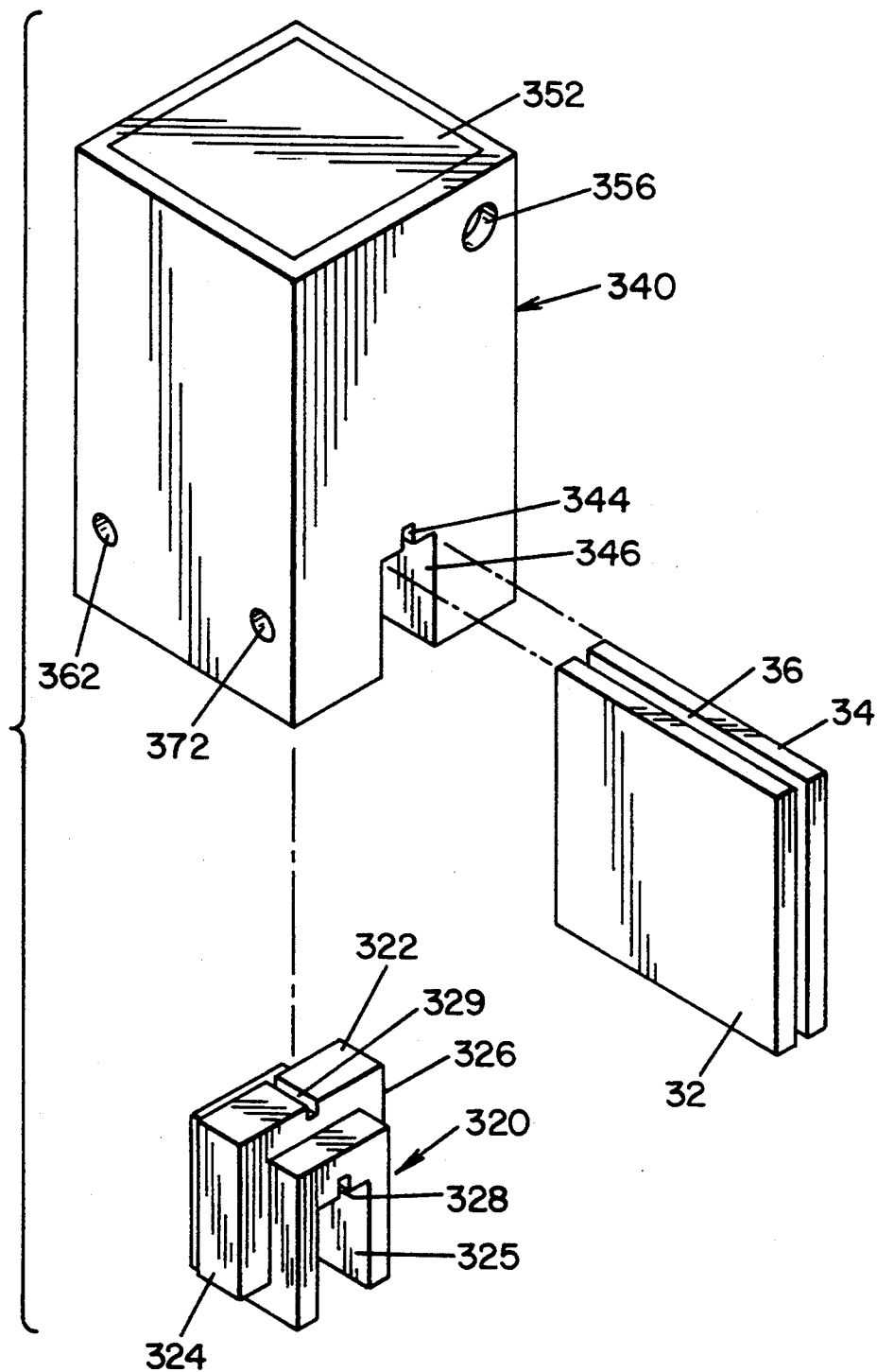
FIG. 12 is an exploded view of t he support housing used in the preferred embodiment.

A primary advantage of the present invention relates to the ability of measuring coil current by a relatively simple mechanical structure or support structure which is easily slipped over the fishtail of coil 30 so that the winding 100 is positioned directly over slit 36. The supporting structure or housing for accomplishing this objective is illustrated in FIGS. 11–13A. In FIG. 11, the winding form 320 includes a saddle shaped spacer 322 having downwardly extending sides or legs 324, 326. Slot 328 receives the insulation sheet between conductors 32, 34 in slit or gap 36. Winding 100 is wrapped around form 320 and the form is positioned over conductors 32, 34, as best shown in FIG. 12. Support housing 340 receives form 320 in a lower recess 342, having a matching kerf 344 in the middle of a slot 346, which slot receives conductors 32, 34. Upper slot 329 above form 320 allows a tie for winding 100 after it is wrapped around space 322. The ends of winding 100 pass upwardly through opening 348 after form 320 is wrapped with winding 100 and is positioned in recess 342. In practice, form 320 is 1.00 inches in length and the center slot 325 has a width of 0.590 inches. The total overall dimension of recess 342 is 1.010 inches in length and 1.510 inches in width. These dimensions match the outer dimensions of form 320. An upper circuit potting chamber 350 contains the circuits that are potted and remain a part of housing 340. Chamber 350 has an upper cover 352. Harness 130 extends through opening 356 to the remote circuitry at the microprocessor. Insulated set screw openings 360, 362 lock housing 340 onto the conductors. Set screws 370, 372 include contacts which engage the opposite conductors 32, 34 for the purpose of sensing the voltage across coil 30, as a direct measurement. A variety of structures or housings could be used for releasable mounting winding 100 over gap or slit 36 at coil 30. The structure illustrated in FIGS. 11–13A is merely representative in nature and is now used as the preferred embodiment.

Figure 14:
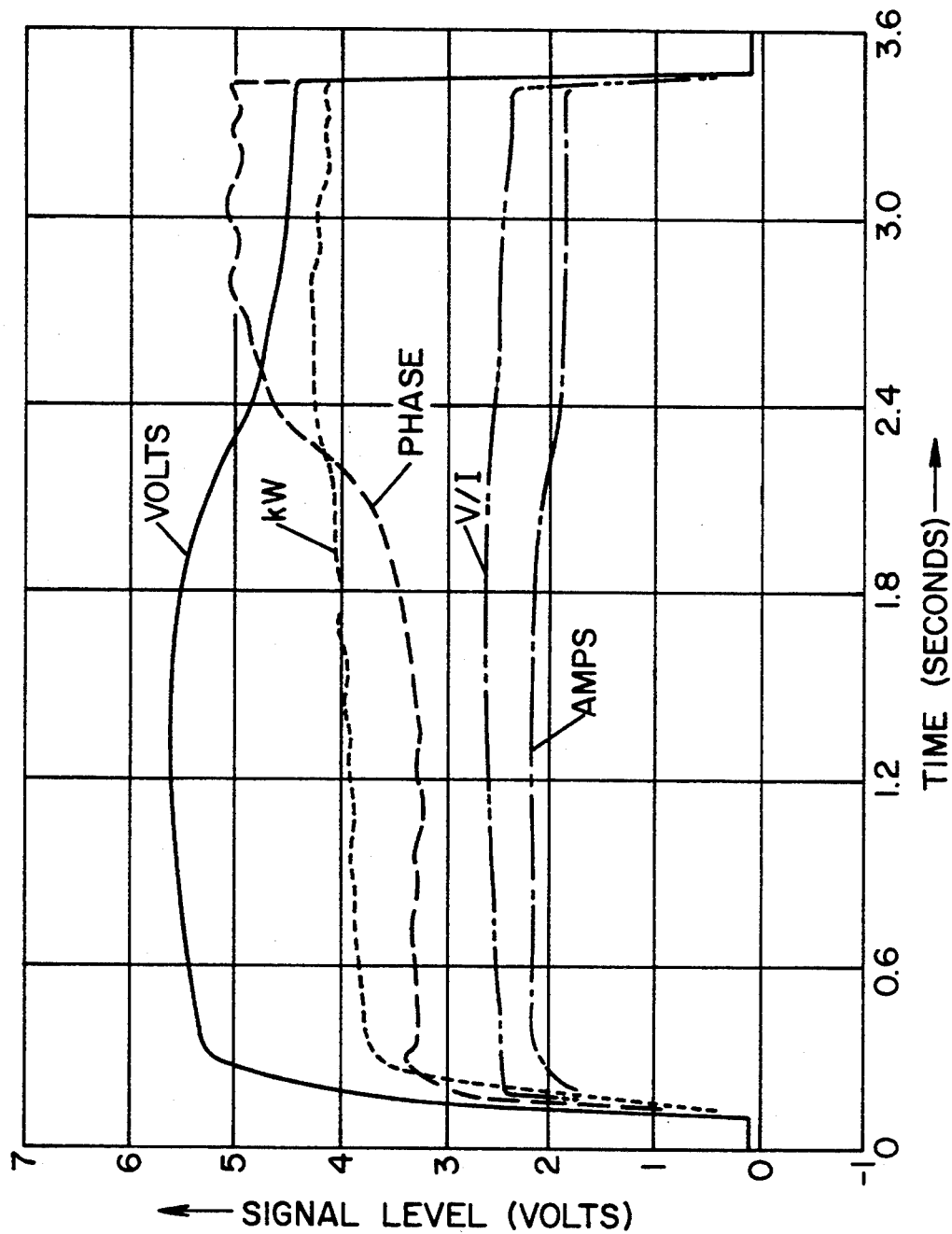
FIG. 14 is an electrical graph based upon time to illustrate parameters created by the circuitry illustrated in FIGS. 9 and 10.

Referring now to FIG. 14, graphs of the several parameters created by the coil monitor are plotted with respect to time. This particular plotting is noted that the phase angle has the most distinct change at the Curie point during the heating process. The cycle length is approximately 3.5 seconds. At approximately 1.8 seconds, the workpiece progresses through the Curie point temperature. The voltage changes only slightly as does the other parameters; however, the phase angle or the cosine of the phase angle changes rapidly. For this reason, one of the primary aspects of the preferred embodiment of the present invention is the use of the coil monitor for the purposes of creating a signal which is indicative of the cosine of the phase angle between the instaneous current and instaneous voltage at the coil. This aspect of the invention is very important and is illustrated in the circuitry of FIG. 7 and the circuitry of FIG. 10.

Figure 15:
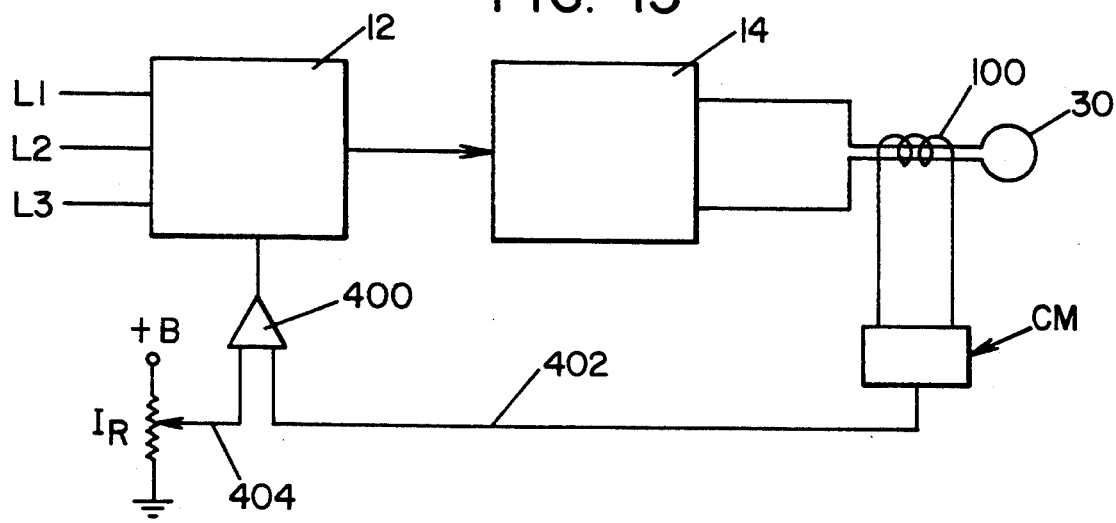
FIG. 15 is a block diagram of a system employing the present invention for controlling the input power of the power supply during the heating cycle.

FIG. 15 shows an application of the present invention wherein the coil monitor produces a signal in line 402 indicative of the power being used by coil 30. Comparitor 400 compares the instaneous power in line 402 with a reference power in line 404 to control the phase angle of SCR network in power supply 12. This illustrates an interactive control system employing coil monitor CM constructed in accordance with the preferred embodiment of the present invention.

Figure 16:
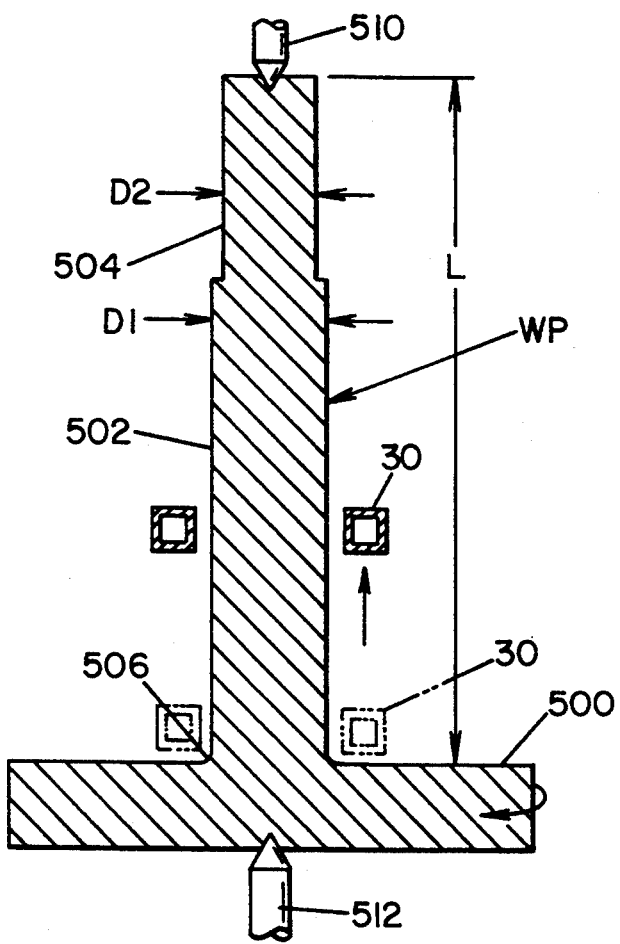
FIG. 16 is a schematic diagram of an induction heating system for scanning a rotating axle shaft and employing a system using the coil monitor of the present invention.

Another application of the present invention is illustrated in FIG. 16 where a workpiece WP, in the form of an axle shaft having a flange 500 and a shaft 502, with a reduced end or spliced portion 504 is rotated on centers 510, 512 and scanned by inductor or coil 30 in accordance with standard induction heating technology. By using the present invention, the fillet 506 can be identified as the start of the scanning operation. By moving workpiece WP upwardly or the conductor 30 downwardly, the impedance of the coil is measured. Such measurement is accomplished by applying a relatively low level AC current to the coil. When the impedance shifts upwardly a pre-selected amount during relative movement of the fillet 506 on flange 500 is identified and the relative movement is stopped. This impedance measurement using FIG. 7 of the present invention allows accurate starting of the heating operation without mechanical or operator intervention. During the scanning operation, full power is applied to coil or inductor 30 until the shoulder between portions 502 and 504 is detected by a change in a parameter. Then the amount of applied power to the coil is reduced to heat splinned portion 504. At the end of workpiece WP, the monitor parameter is changed drastically. Thus, the heating cycle is terminated as the end is approached and reached. This operation is an advantage over prior methods based upon length of the workpiece, since the length of the workpiece varies substantially as it increases in temperature. The present invention facilitates easy identification of a fillet 506 and the reduced dimensions of workpiece WP and end of workpiece WP as the induction heating process commences during scanning of the axle shaft, as shown in FIG. 16.

Figure 16A:
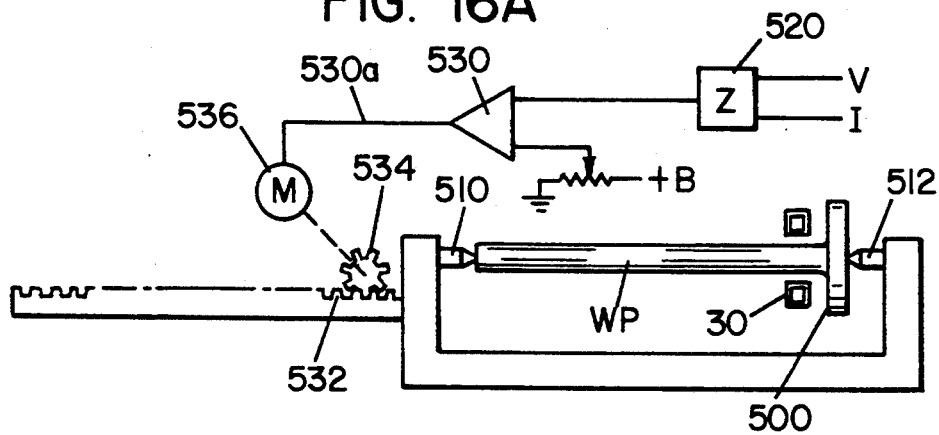
FIG. 16A is a schematic diagram of the process illustrated in FIG. 16 employing still a further aspect of the present invention.
Figure 17:
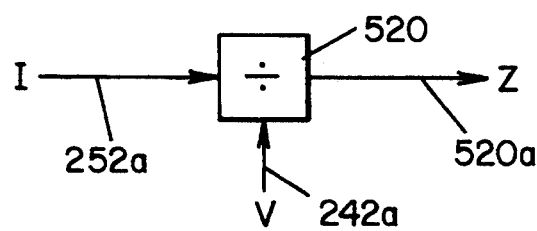
FIG. 17 is a block diagram illustrating the creation of an impedance signal as used in FIG. 16A and based upon the in-phase voltage and current signal created in accordance with the present invention.

FIG. 17 shows a schematic diagram of a hardwired circuit to combine the DC level on lines 242a and 252a for the purposes of creating an impedance value used in FIG. 16. This impedance value is created by the microprocessor and can be plotted as shown in FIG. 14 as graph V/I. The block 520 represents the creation of the value of impedance Z and this manipulation of the parameters is accomplished by the microprosssor, by a computer or by a hard wire circuit, the latter of which is illustrated. The present invention causes this parameter Z to be more accurately determined since the current value is based upon the current directly at coil or inductor 30. The use of impedance Z from block 520 is illustrated in FIG. 16A which combines the showing of FIGS. 16 and 17. A comparator 530 having an output 530a drives a rack and pinion 532, 534 through a servo motor 536. This is a mechanism for controlling movement of workpiece WP with respect to coil 30 for the purposes of scanning the shaft of the workpiece. Motor 536 is operated by deviations of the measured impedance Z from a known impedance. FIG. 16A shows an implementation of the present invention to scan an axle shaft, as schematically illustrated in FIG. 16, using the impedance circuit shown in FIG. 17.

Figure 18:
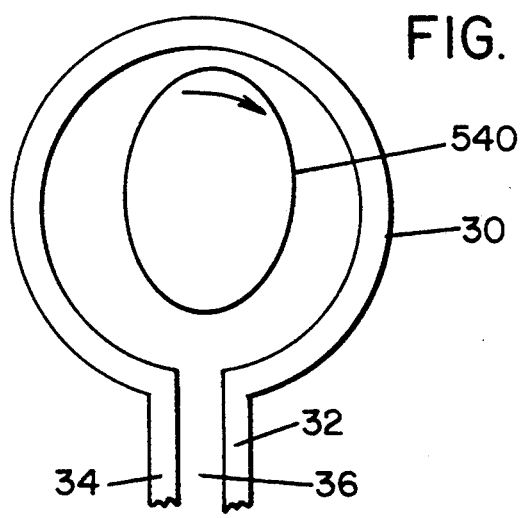
FIG. 18 is a cross sectional view of an eccentric workpiece rotating in an induction heating coil and adapted to be monitored by a system employing the preferred embodiment of the present invention.
Figure 19:
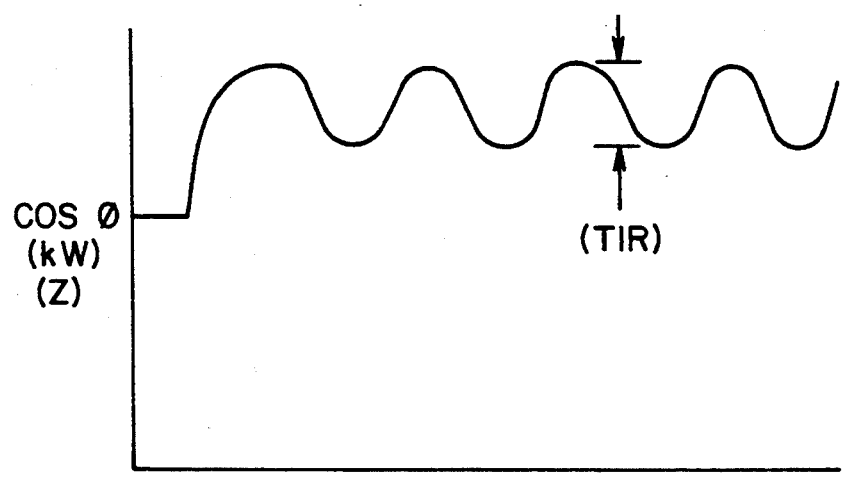
FIG. 19 is a graph of the phase angle, power or impedance created by a system employing the present invention and monitoring the eccentric workpiece as shown in FIG. 18.

Referring now to FIGS. 18 and 19, an eccentric workpiece 540, such as a cam of a camshaft, is rotated in inductor or coil 30. By using the present invention, a parameter from the coil monitor produces an output signal such as shown in FIG. 19. This oscillatory output signal is caused by the nose of the cam passing the fishtail area. This occurs periodically and produces a different impedance when the nose of the cam 540 is adjacent to the fishtail. The curve in FIG. 19 can be employed for modulating the coil power, while the workpiece is rotated, or for pulsing the power during rotation. This same concept is used for detecting eccentricity and out-of-around conditions for workpiece being rotated within coil 30. By employing this aspect of the invention, there is no tendency to overheat the nose of cam 540 as it is being rotated within conductor 30.

FIGS. 20-22 relate to the use of the present invention for signature analysis. As shown in FIG. 20, the trace or graph of the cosine of the phase angle is the dashed line. The solid lines are the desired signature for workpiece, relative to time. If the dashed line intersects the solid line, the workpiece is rejected. This trace or graph, as shown in FIG. 20, may be recorded by mechanism 114 or can be displayed by mechanism 112. FIG. 21 illustrates a complex signature analysis system wherein the impedance in line 520a at the output of block 520 in FIG. 17 is multiplied by block 550 with the value on line 190a and introduced into a signature analysis mechanism or system 552. If the profile, which is the product of two parameters such as impedance and phase angle, exceeds the solid line signature in signature analysis device 552, the dash line profile intersects a solid line signature and rejects the workpiece. The reject signal is created at line 552a. In the alternative, the signature profile is recorded in an appropriate device by placing information on output line 552b. Line 552c carries information shown as the dash line profile for controlling the induction heating cycle. An alternative dual signal control arrangement is illustrated in FIG. 22 where signature analysis 560 is controlled by a single parameter, such as impedance. A reject signal appears on line 560a if the impedance does not comply with the desired signature. In a like matter, signature analysis device 562 monitors another parameter, such as the cosine of the phase angle. If the signal appears in line 560a or 562a, gate 570 creates an output signal in line 572. This gate signal indicates that one of the two parameters being monitored is outside of the desired signature. In a like manner, the first profile is recorded by the device controlled by output line 560b. The process is controlled by the value in line 560c. The other parameter being monitored by the present invention produces a signal in line 562b for recording the signature profile during the heating operation. The heating cycle can be controlled by information available on line 562c. By using the signature analysis, a workpiece can be checked for the purposes of exceeding a desired profile. In addition, the actual process on a real-time basis is recorded or an interactive control is used with the signature analysis device, as schematically illustrated in FIGS. 20–22 and illustrated, also, in FIG. 10.

Having thus defined the invention, the following is claimed:

1. A monitor device for creating a current signal having a voltage representative of the instantaneous alternating current in an induction heating coil connected to an alternating current supply by two closely spaced, parallel input conductors separated by a narrow gap through which flows the flux created by said alternating current in said parallel conductors, said gap defining oppositely facing, elongated flux passages, said monitor device comprising: a multiturn sensing winding, means for securing said winding between said parallel conductors and over one of said flux passages without encircling said parallel conductors whereby the flux flowing through said gap intersects said turns of said sensing winding, and means for creating said current signal by the induced voltage in said winding.

2. A monitor as defined in claim 1 wherein said gap has a spacing of about 0.020–0.100 inches.

3. A monitor as defined in claim 2 further including a support housing including said securing means, said housing having an elongated slot means for engaging both of said conductors from the side of said conductors defining said one of said flux passages.

4. A monitor as defined in claim 1 wherein said conductors are generally rectangular in cross section.

5. A monitor as defined in claim 4 further including a support housing including said securing means, said housing having an elongated slot means for engaging both of said conductors from the side of said conductors defining said one of said flux passages.

6. A monitor as defined in claim 1 including means for creating a voltage signal having a voltage indicative of the instantaneous voltage in said induction heating coil, said voltage signal creating means comprising a first contact engaging one of said conductors and a second contact engaging said other conductors.

7. A monitor as defined in claim 6 further including a support housing including said securing means, said housing having an elongated slot means for engaging both of said conductors from the side of said conductors defining said one of said flux passages.

8. A monitor as defined in claim 6 including scaler means for inversely changing said current signal as a function of frequency.

9. A monitor as defined in claim 8 wherein said scaler means is a low pass filter with a band width substantially less than the operating frequency of said induction heating coil.

10. A monitor as defined in claim 9 wherein said band width is less than 1.0 kHz.

11. A monitor as defined in claim 10 including processing means for creating a phase angle signal, said processing means comprising means for rectifying current signal into a first D.C. voltage level, means rectifying said voltage signal into a second D.C. voltage level, means for multiplying said first and second D.C. voltage levels to obtain a product and means for dividing the instantaneous kW of said coil by said product.

12. A monitor as defined in claim 6 including processing means for creating a phase angle signal, said processing means comprising means for rectifying current signal into a first D.C. voltage level, means rectifying said voltage signal into a second D.C. voltage level, means for multiplying said first and second D.C. voltage levels to obtain a product and means for dividing the instantaneous kW of said coil by said product.

13. A monitor as defined in claim 1 further including a support housing including said securing means, said housing having an elongated slot means for engaging both of said conductors from the side of said conductors defining said one of said flux passages.

14. A monitor as defined in claim 1 including scaler means for inversely changing said current signal as a function of frequency.

15. A monitor as defined in claim 14 wherein said scaler means is a low pass filter with a band width substantially less than the operating frequency of said induction heating coil.

16. A monitor as defined in, claim 15 wherein said band width is less than 1.0 kHz.

17. A system for detecting a change in a physical property of a workpiece being inductively heated, said system comprising: a monitor device for creating a current signal having a voltage representative of the instantaneous alternating current in an induction heating coil used to heat said workpiece and connected to an alternating current supply by two closely spaced, parallel input conductors separated by a narrow gap through which flows the flux created by said alternating current in said parallel conductors, said gap defining oppositely facing, elongated flux passages, said monitor device comprising: a multiturn sensing winding, means for securing said winding between said parallel conductors and over one of said flux passages without encircling said parallel conductors whereby the flux flowing through said gap intersects said turns of said sensing winding, and means for creating said current signal by the induced voltage in said winding; means for causing said workpiece to be heated by said induction heating coil in a heating cycle with current from said power supply passing through said coil; means for creating a composite signal using said current signal; and, means for indicating when said composite signal changes in a manner indicative of said change in said physical property of said workpiece.

18. A system for detecting a change in a physical property of a workpiece being inductively heated, said system comprising: a monitor device for creating a current signal having a voltage representative of the instantaneous alternating current in an induction heating coil used to heat said workpiece and connected to an alternating current supply by two closely spaced, parallel input conductors separated by a narrow gap through which flows the flux created by said alternating current in said parallel conductors, said gap defining oppositely facing, elongated flux passages, said monitor device comprising: a multiturn sensing winding, means for securing said winding between said parallel conductors and over one of said flux passages without encircling said parallel conductors whereby the flux flowing through said gap intersects said turns of said sensing winding, and means for creating said current signal by the induced voltage in said winding; means for causing said workpiece to be heated by said induction heating coil with current from said coil; means for creating a phase angle signal with said current signal; and, means for detecting variations in said phase angle signal as said workpiece rotates in said coil.

19. A signature analysis system for determining compliance of selected parameters of an induction heating process for a workpiece with a known value of said selected parameter over a heating cycle of said workpiece, said system comprising: a monitor device for creating a current signal having a voltage representative of the instantaneous alternating current in an induction heating coil used to heat said workpiece and connected to an alternating current supply by two closely spaced, parallel input conductors separated by a narrow gap through which flows the flux created by said alternating current in said parallel conductors, said gap defining oppositely facing, elongated flux passages, said monitor device comprising: a multiturn sensing winding, means for securing said winding between said parallel conductors and over one of said flux passages without encircling said parallel conductors whereby the flux flowing through said gap intersects said turns of said sensing winding, and means for creating said current signal by the induced voltage in said winding; means for causing said workpiece to be heated in an induction heating process by said induction heating coil; means for creating an output signal indicative of said selected parameter by use of said current signal; means for comparing said output signal over said process heating cycle with said known values; and, means for recording said comparison.

20. A signature analysis system for determining compliance of selected parameters of an induction heating process for a workpiece with a known value of said selected parameter over a heating cycle of said workpiece, said system comprising: a monitor device for creating a current signal having a voltage representative of the instantaneous alternating current in an induction heating coil used to heat said workpiece and connected to an alternating current supply by two closely spaced, parallel input conductors separated by a narrow gap through which flows the flux created by said alternating current in said parallel conductors, said gap defining oppositely facing, elongated flux passages, said monitor device comprising: a multiturn sensing winding, means for securing said winding between said parallel conductors and over one of said flux passages without encircling said parallel conductors whereby the flux flowing through said gap intersects said turns of said sensing winding, and means for creating said current signal by the induced voltage in said winding; means for causing said workpiece to be heated in an induction heating process by said induction heating coil; means for creating an output signal indicative of said selected parameter by use of said current signal; means for comparing said output signal over said process heating cycle with said known values; and, means for detecting when said output signal indicates non-compliance with said standard value.

21. A scanning device for an elongated metal workpiece, comprising means for moving a coil along said workpiece; sensing means for creating a voltage signal having a voltage representative of the instantaneous alternating current in said coil which is connected to an alternating current supply by two closely spaced, parallel input conductors separated by a narrow gap through which flows the flux created by said alternating current in said parallel conductors; said gap defining oppositely facing, elongated flux passages, a multiturn sensing winding supported on said sensing means; means for securing said winding on said sensing means in a position between said parallel conductors and over one of said flux passages without encircling said parallel conductors whereby the flux flowing through said gap intersects said turns of said sensing winding; means for creating said current signal by the induced voltage in said winding; and, means for crating a parameter indicative signal in response to said current signal.

22. A monitor device for creating a current voltage signal representative of the instantaneous alternating current in an induction heating coil connected to an alternating current supply by two closely spaced, parallel input conductors separated by a narrow gap through which flows the flux created by said alternating current in said parallel conductors, said gap defining oppositely facing, elongated flux passages, said monitor device comprising: means for sensing the rate of change of said flux, means responsive to said sensing means for creating a voltage signal as a function of the magnitude frequency of said alternating current, means for removing the frequency function from said voltage signal to give a new voltage signal whereby said new voltage signal is a function of said magnitude of said current; and, means for using said new voltage signal as representative of said magnitude of said current in said induction heating coil.

* * * * *